United States Patent
Yang et al.

(10) Patent No.: US 7,113,030 B2
(45) Date of Patent: Sep. 26, 2006

(54) CLASS-D POWER AMPLIFIER CAPABLE OF ELIMINATING EXCESSIVE RESPONSE PHENOMENON WHEN RETURNING TO A STEADY STATE FROM AN ABNORMAL STATE AND AN AMPLIFICATION METHOD THEREOF

(75) Inventors: Chung-Gil Yang, Gunpo-si (KR); Jae-Hoon Jeong, Seoul (KR); Goog-Chun Cho, Gunpo-si (KR)

(73) Assignee: Samsung Electronics Co., Ltd., (KR)

( * ) Notice: Subject to any disclaimer, the term of this patent is extended or adjusted under 35 U.S.C. 154(b) by 87 days.

(21) Appl. No.: 10/821,527

(22) Filed: Apr. 9, 2004

(65) Prior Publication Data

US 2004/0222845 A1    Nov. 11, 2004

(30) Foreign Application Priority Data

May 10, 2003   (KR) ..................... 10-2003-0029624

(51) Int. Cl.
*H03F 3/38* (2006.01)
(52) U.S. Cl. .................................. 330/10; 330/207 A
(58) Field of Classification Search .................. 330/10, 330/207 A, 251
See application file for complete search history.

(56) References Cited

U.S. PATENT DOCUMENTS 5,805,020 A * 9/1998 Danz et al. ................... 330/10
6,489,840 B1 * 12/2002 Botti et al. ................... 330/10

FOREIGN PATENT DOCUMENTS

EP          1 184 973 A1    6/2002
KR    1020030015764 A      2/2003

* cited by examiner

*Primary Examiner*—Benny Lee
*Assistant Examiner*—Hieu Nguyen
(74) *Attorney, Agent, or Firm*—F. Chau & Associates, LLC

(57) ABSTRACT

A class-D power amplifier, which prevents excessive response phenomenon from occurring when returning to a steady state from an abnormal state and an amplification method of the class-D power amplifier are provided. The class-D power amplifier prevents an integral control circuit or a proportional integral control circuit from becoming saturated by using sub-negative feedback loop operations, without using a high-capacity output blocking switch in an initial state or an abnormal state. Thus, suppressing pop noise due to the excessive response phenomenon caused when the class-D power amplifier returns to the steady state from the initial state or the abnormal state and reducing power consumption.

19 Claims, 2 Drawing Sheets

CLASS-D POWER AMPLIFIER CAPABLE OF ELIMINATING EXCESSIVE RESPONSE PHENOMENON WHEN RETURNING TO A STEADY STATE FROM AN ABNORMAL STATE AND AN AMPLIFICATION METHOD THEREOF

CROSS-REFERENCE TO RELATED APPLICATION

This application claims priority to Korean Patent Application No. 2003-29624, filed on 10 May 2003 at the Korean Intellectual Property Office, the disclosure of which is incorporated herein by reference.

BACKGROUND OF THE INVENTION

1. Technical Field

The present invention relates to a power amplifier, and more particularly, to a class-D power amplifier for use as an audio amplifier, and an amplification method thereof.

2. Discussion of the Related Art

In the past, class-A, class-B, and class-AB power amplifiers, which perform linear amplification, have been used as mainstream audio power amplifiers. Recently, however, there has been research conducted on class-D power amplifiers, which perform amplification by utilizing switching operations based on pulse width modulation (PWM). Research has shown that class-D power amplifiers have poor linearity and superior power efficiency as compared to class-A, class-B, and class-AB power amplifiers, which have superior linearity and poor power efficiency.

Switching operations based on PWM in class-D power amplifiers result in harmonic distortion caused by high-frequency components and oscillations. To overcome such harmonic distortion, negative feedback has been used in class-D power amplifiers. In addition, because an audio power amplifier is driven with high current, it has additional functions for protecting components in an initial state or an abnormal state, such as an over-current condition or a power-failure state. U.S. Pat. Nos. 5,805,020 and 6,420,930 disclose exemplary class-D power amplifiers using negative feedback.

In a conventional class-D power amplifier using negative feedback, a predetermined switch is opened in the initial state or the abnormal state and negative feedback looping is blocked, thereby preventing over-current from flowing through the load side, such as a speaker. Here, an integral control circuit or proportional integral control circuit is input with a finite error signal and reaches a saturation state. In the saturation state, the predetermined switch is closed and there is a negative feedback loop so that the class-D power amplifier enters a steady state after the initial state or exits from an abnormal state. Then, because the integral control circuit or proportional integral control circuit is in the saturation state, an output signal exhibits an unstable excessive response phenomenon while the class-D power amplifier reaches the steady state.

To remedy the unstable excessive response phenomenon, the conventional class-D power amplifier includes an output-blocking switch before the load side, which outputs the output signal to the load side after the excessive response phenomenon is removed, and then the class-D power amplifier reaches the steady state. The rated power of the output-blocking switch corresponds to power consumed by the entire amplifying system in the steady state, which results in high power consumption by the conventional class-D power amplifier.

SUMMARY OF THE INVENTION

The present invention provides a class-D power amplifier, which prevents an excessive response phenomenon from occurring when the amplifier returns to a steady state from an abnormal state without using a high-capacity output-blocking switch. The present invention also provides an amplification method for a class-D power amplifier, which prevents an excessive response phenomenon from occurring when the amplifier returns to a steady state from an abnormal state without using a high-capacity output-blocking switch.

According to one aspect of the present invention, there is provided a class-D power amplifier comprising a summing circuit, an integral control circuit, a feedback control circuit, a switching circuit, a sub-negative feedback circuit, a controlled circuit, and a steady-state negative feedback circuit.

The summing circuit outputs an error signal by summing an input signal with one of a first negative feedback signal and a second negative feedback signal. The integral control circuit outputs an integral signal by integrating the error signal. The feedback control circuit generates and outputs a switching control signal whose logic state changes according to the logic state of an abnormal state detecting signal generated in response to a monitoring signal.

The switching circuit switched the integral signal to one of a sub-loop and a steady-state loop in response to the switching control signal. The sub-negative feedback circuit receives and processes the integral signal and generates and outputs a sub-negative feedback signal as the first negative feedback signal. The controlled circuit modulates the integral signal into a pulse width modulation (PWM) signal and outputs an output signal. The steady-state negative feedback circuit receives and processes the output signal from the controlled circuit and generates and outputs a steady-state negative feedback signal as the second negative feedback signal.

The controlled circuit comprises a PWM circuit, a switching amplification circuit, and a low-pass filter (LPF) circuit. The PWM circuit modulates the integral signal output to the steady-state loop into the PWM signal using a sawtooth wave signal and outputs a PWM signal. The switching amplification circuit outputs an amplified signal according to the PWM signal. The low-pass filter (LPF) circuit receives the amplified signal and outputs a low-pass filtered signal generated by performing low-pass filtering on the amplified signal.

The feedback control circuit comprises a sawtooth wave signal generator, a slope detector, an abnormal state detector, and a feedback decider. The sawtooth wave signal generator generates and outputs the sawtooth wave signal. The slope detector generates and outputs a signal representing the slope of the sawtooth wave signal, where the logic state of the signal representing the slope of the sawtooth wave signal changes according the slope of the sawtooth wave signal. In response to the monitoring signal, the abnormal state detector generates and outputs the abnormal state detection signal that has different logic states when the monitoring signal is greater than an upper threshold and less than a lower threshold. The feedback decider generates the switching control signal whose logic state changes according to the logic state of the abnormal state detection signal and outputs the switching control signal.

When the integral signal is switched from the sub-loop to the steady-state loop, the logic state of the switching control signal changes in synchronization with the signal representing the slope of the sawtooth wave signal. The monitoring signal is greater than the upper threshold in the abnormal state and the sub-negative feedback signal generated in the abnormal state prevents the integral signal from becoming saturated.

The PWM signal maintains a pulse width that is half the pulse width of the PWM signal in a steady-state when the input signal is a fog signal, after the logic state of the switching control signal changes when the integral signal is switched from the sub-loop to the steady-state loop. The pulse width of the PWM signal is the same pulse width as the pulse width of the switching control signal when the integral signal is switched from the sub-loop to the steady-state loop.

According to another aspect of the present invention, there is provided an amplification method of a class-D power amplifier. The amplification method comprises: (a) outputting an error signal by summing an input signal with one of a first negative feedback signal and a second negative feedback signal, (b) outputting an integral signal by integrating the error signal, (c) generating and outputting a switching control signal whose logic state changes according to the logic state of an abnormal state detection signal generated in response to a monitoring signal, (d) switching the integral signal to one of a sub-loop and a steady-state loop in response to the logic state of the switching control signal, (e) receiving and processing the integral signal and generating and outputting a sub-negative feedback signal as the first negative feedback signal, (f) receiving and modulating the integral signal into a PWM signal and outputting an output signal, and (g) processing the output signal and generating and outputting a steady-state negative feedback signal as the second negative feedback signal.

Step (f) comprises modulating the integral signal output to the steady-state loop into the PWM signal using a sawtooth wave signal and outputting the PWM signal, outputting an amplified signal according to the PWM signal, and outputting the output signal generated by performing low-pass filtering on the amplified signal.

Step (c) comprises generating and outputting the sawtooth wave signal, generating and outputting a signal representing the slope of the sawtooth wave signal, where the logic state of the signal representing the sawtooth wave signal changes according to the slope of the sawtooth wave signal, in response to the monitoring signal, generating and outputting the abnormal state detection signal that has different logic states when the monitoring signal is greater than an upper threshold and less than a lower threshold, and generating the switching control signal whose logic state changes according to the logic state of the abnormal state detection signal and outputting the switching control signal.

According to yet another aspect of the present invention, a class-D amplifier for generating an unsaturated integral signal, comprises: a switching circuit for receiving an integral signal and outputting the integral signal to one of a sub-loop and a steady-state loop; a sub-loop for receiving the integral signal and generating and outputting a first negative feedback signal; a controlled circuit for receiving the integral signal, modulating the integral signal into an output signal, amplifying the output signal, filtering the output signal, and outputting the output signal; and a steady-state loop for receiving the output signal and generating and outputting a second negative feedback signal; wherein the integral signal is unsaturated due to the first and second negative feedback signals.

BRIEF DESCRIPTION OF THE DRAWINGS

The aspects of the present invention will become more apparent by describing in detail exemplary embodiments thereof with reference to the attached drawings, in which.

DETAILED DESCRIPTION OF EXEMPLARY EMBODIMENTS

Figure 1:
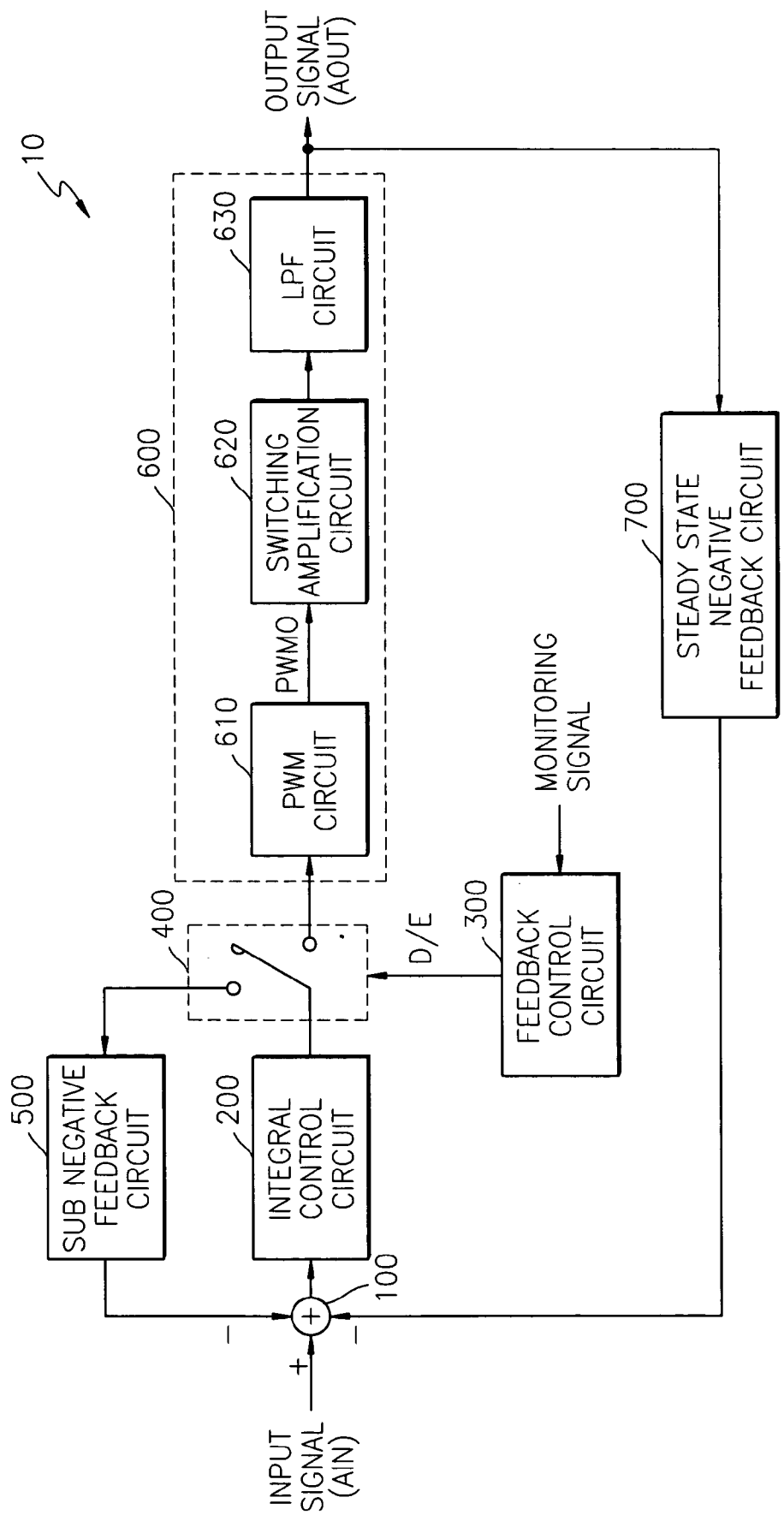
FIG. 1 is a block diagram of a class-D power amplifier according to an exemplary embodiment of the present invention.

FIG. 1 is a block diagram of a class-D power amplifier 10 according to an exemplary embodiment of the present invention. Referring to FIG. 1, the class-D power amplifier 10 includes a summing circuit 100, an integral control circuit 200, a feedback control circuit 300, a switching circuit 400, a sub-negative feedback circuit 500, a controlled circuit 600, and a steady-state negative feedback circuit 700.

The summing circuit 100 sums an input signal AIN and a negative feedback signal and outputs an error signal. Here, the input signal AIN is an audio signal and the negative feedback signal is a sub-negative feedback signal output from the sub-negative feedback circuit 500 or a steady-state negative feedback signal output from the steady-state negative feedback circuit 700, as will be described below. The sub-negative feedback signal or the steady-state negative feedback signal is selected as the negative feedback signal according to a switching control signal D/E output from the feedback control circuit 300.

The integral control circuit 200 outputs an integral signal that is proportionally integrated to the error signal. The feedback control circuit 300 generates and outputs the switching control signal D/E whose logic state changes according to the logic state of an abnormal state detecting signal that is generated in response to a monitoring signal.

Figure 2:
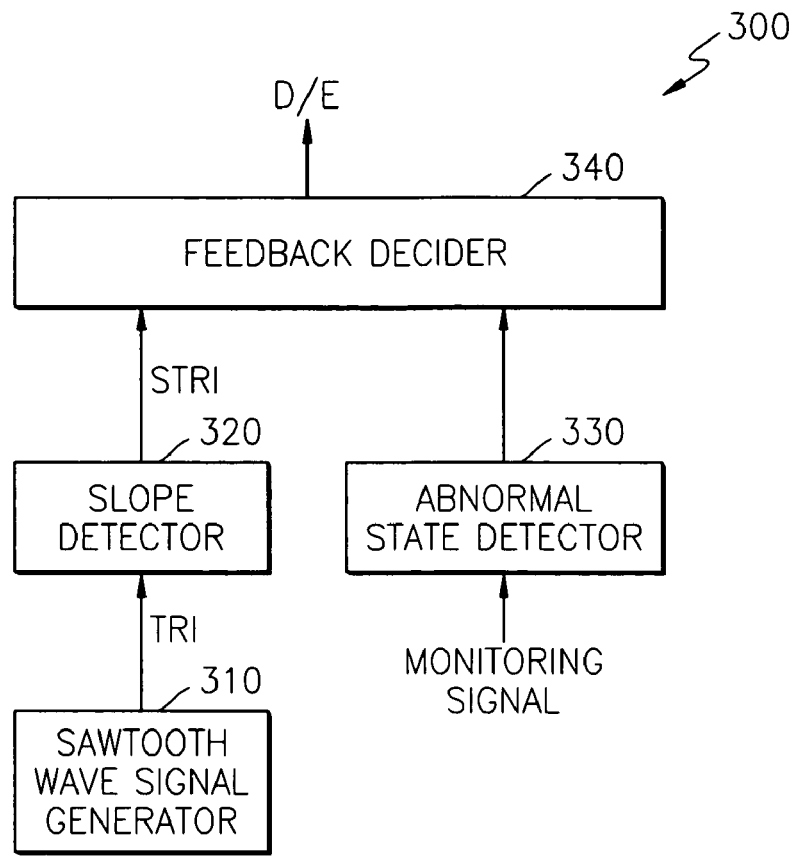
FIG. 2 is a block diagram of a feedback control circuit of FIG. 1.

FIG. 2 is a block diagram of the feedback control circuit 300 of FIG. 1. Referring to FIG. 2, the feedback control circuit 300 includes a sawtooth wave signal generator 310, a slope detector 320, an abnormal state detector 330, and a feedback decider 340.

The sawtooth wave signal generator 310 generates and outputs a sawtooth wave signal TR1. The sawtooth wave signal TR1 is used in a pulse width modulation (PWM) circuit 610 of the controlled circuit 600. The slope detector 320 generates a signal STR1 representing the slope of the sawtooth wave signal TR1, where the logic state of the sawtooth wave slope representing signal STR1 changes as the slope of the sawtooth wave signal TR1 changes from positive to negative and vice versa.

In response to the monitoring signal, the abnormal state detector 330 generates and outputs an abnormal state detection signal that has different logic states when the monitoring signal is greater than a predetermined upper threshold value and less than a predetermined lower threshold value. Here, the predetermined threshold values are set to be suitable for the desired monitoring capabilities of the class-D power amplifier 10. Thus, the monitoring signal is typically greater than the set predetermined upper threshold value in an abnormal state such as the initial state, an over-current condition, or a power-failure state. The monitoring signal is used to monitor a state in which high power is supplied to the load side such as the speaker, i.e., an abnormal state. The monitoring signal may be an output signal AOUT, a modulated signal of the output signal AOUT, or a signal of part of the controlled circuit 600.

Figure 3:
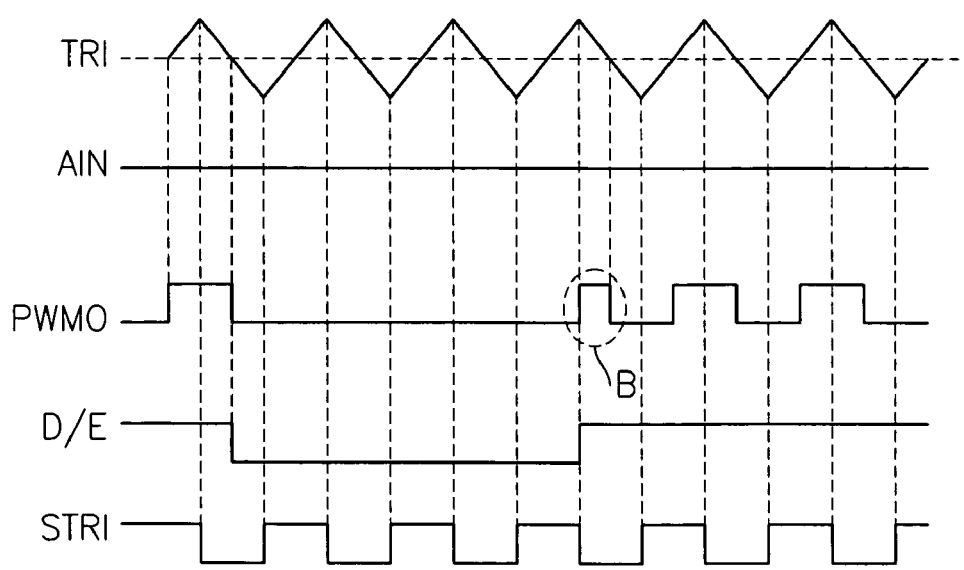
FIG. 3 is a waveform illustrating an operation of FIGS. 1 and 2 when a fog signal is input.

The feedback decider 340 generates and outputs the switching control signal D/E whose logic state changes according to the logic state of the abnormal state detection signal. Here, when the output direction of the integral signal changes from a sub-loop to a steady-state loop, the logic state of the switching control signal D/E changes in synchronization with the signal STR1, as shown in FIG. 3.

In FIG. 1, the switching circuit 400 receives an integral signal and outputs the integral signal to the sub-loop (i.e., the sub-negative feedback circuit 500) or to the steady-state loop (i.e., the steady-state negative feedback circuit 700) by performing a switching operation corresponding to the logic state of the switching control signal D/E.

The sub-negative feedback circuit 500 processes the integral signal output to the sub-loop and generates and outputs a sub-negative feedback signal as the negative feedback signal. A sub-negative feedback signal generated in an abnormal state prevents the integral signal from becoming saturated.

The controlled circuit 600 modulates the integral signal output to the steady-state loop into a PWM signal PWMO, generates an output signal AOUT using switching amplification and low-pass filtering according to the PWM signal PWMO, and outputs signal AOUT.

As shown in FIG. 1, the controlled circuit 600 includes a PWM circuit 610, a switching amplification circuit 620, and a low-pass filter (LPF) circuit 630. The PWM circuit 610 modulates the integral signal output to the steady-state loop into a PWM signal PWMO using the sawtooth wave signal TR1. After the logic state of the switching control signal D/E changes when the output direction of the integral signal is switched from the sub-loop to the steady-state loop, the PWM signal PWMO maintains a pulse width (indicated by B in FIG. 3) that is half the pulse width of the PWM signal PWMO in the steady-state when the input signal AIN is a fog signal. Here, the PWM signal PWMO has the same pulse width (logic high in FIG. 3) as the switching control signal D/E when the output direction of the integral signal is switched from the sub-loop to the steady-state loop. The fog signal of the input signal AIN is the signal that has no audio signal.

The switching amplification circuit 620 outputs an amplified signal by the switching operation of the switching circuit 400 according to the PWM signal PWMO. The switching amplification circuit 620 outputs the amplified signal by switching operations of a push-up switch and a pull-down switch in response to the PWM signal PWMO.

The LPF circuit 630 outputs an output signal AOUT after low-pass filtering the amplified signal. Low-pass filtering indicates integrating an input digital signal or converting the input digital signal into an analog signal. The output signal AOUT is output to the load side, such as a speaker, and converted to sound.

In FIG. 1, the steady-state negative feedback circuit 700 processes the output signal AOUT and generates and outputs a steady-state feedback signal as the negative feedback signal.

As pointed out above, the class-D power amplifier 10 includes a switching circuit 400 that receives the integral signal and outputs the integral signal to the sub-loop or to the steady-state loop and the sub-negative feedback circuit 500 that processes the integral signal output to the sub-loop, generates a negative feedback signal, and outputs a sub-negative feedback signal. Consequently, the integral signal is not saturated due to the sub-negative feedback signal generated in an abnormal state.

As described above, the class-D power amplifier 10 prevents the integral control circuit or proportional integral control circuit from becoming saturated by sub-negative feedback loop operations, without using a high-capacity output blocking switch in an initial state or abnormal state. Therefore, it is possible to suppress pop noise due to excessive response characteristics caused when the class-D power amplifier 10 returns to a steady state from an initial state or an abnormal state. In addition, power consumption can be reduced when compared with a conventional power amplifier that uses the output-blocking switch.

As the present invention has been particularly shown and described with reference to exemplary embodiments thereof, it will be understood by those of ordinary skill in the art that various changes in form and details may be made therein without departing from the spirit and scope of the invention as defined by the appended claims and their equivalents.

What is claimed is:

1. A class-D power amplifier comprising:
   a summing circuit, which outputs an error signal by summing an input signal with one of a first negative feedback signal and a second negative feedback signal;
   an integral control circuit, which outputs an integral signal by integrating the error signal;
   a feedback control circuit, which generates and outputs a switching control signal whose logic state changes according to the logic state of an abnormal state detecting signal generated in response to a monitoring signal;
   a switching circuit, which switches the integral signal to one of a sub-loop and a steady-state loop in response to the switching control signal;
   a sub-negative feedback circuit, which receives and processes the integral signal and generates and outputs a sub-negative feedback signal as the first negative feedback signal;
   a controlled circuit, which receives and modulates the integral signal into a pulse width modulation (PWM) signal and generates an output signal, wherein the monitoring signal is the output signal or a modulated version of the output signal; and
   a steady-state negative feedback circuit, which receives and processes the output signal from the controlled circuit and generates and outputs a steady-state negative feedback signal as the second negative feedback signal.

2. The class-D power amplifier of claim 1, wherein the controlled circuit comprises:
   a PWM circuit, which modulates the integral signal output to the steady-state loop into the PWM signal using a sawtooth wave signal and outputs a PWM signal;
   a switching amplification circuit, which outputs an amplified signal using switching according to the PWM signal; and
   a low-pass filter (LPF) circuit, which receives the amplified signal and outputs a low-pass filtered signal generated by performing low-pass filtering on the amplified signal.

3. The class-D power amplifier of claim 1, wherein the feedback control circuit comprises:

a sawtooth wave signal generator, which generates and outputs a sawtooth wave signal;

a slope detector, which generates and outputs a signal representing the slope of the sawtooth wave signal, where the logic state of the signal representing the slope of the sawtooth wave signal changes according the slope of the sawtooth wave signal;

an abnormal state detector, which, in response to the monitoring signal, generates and outputs the abnormal state detection signal that has different logic states when the monitoring signal is greater than an upper threshold and less than a lower threshold; and a feedback decider, which generates the switching control signal whose logic state changes according to the logic state of the abnormal state detection signal and outputs the switching control signal.

4. The class-D power amplifier of claim 3, wherein when the output of the integral signal is switched from the sub-loop to the steady-state loop, the logic state of the switching control signal changes in synchronization with the signal representing the slope of the sawtooth wave signal.

5. The class-D power amplifier of claim 3, wherein the monitoring signal is greater than the upper threshold in the abnormal state.

6. The class-D power amplifier of claim 5, wherein the sub-negative feedback signal generated in the abnormal state prevents the integral signal from becoming saturated.

7. The class-D power amplifier of claim 1, wherein the PWM signal maintains a pulse width that is half the pulse width of the PWM signal in a steady-state when the input signal is a fog signal, after the logic state of the switching control signal changes according to switching the integral signal from the sub-loop to the steady-state loop.

8. The class-D power amplifier of claim 7, wherein the pulse width of the PWM signal is the same pulse width as the pulse width of the switching control signal when the integral signal is switched from the sub-loop to the steady-state loop.

9. An amplification method of a class-D power amplifier comprising;

(a) outputting an error signal by summing an input signal with one of a first negative feedback signal and a second negative feedback signal;

(b) outputting an integral signal by integrating the error signal;

(c) generating and outputting a switching control signal whose logic state changes according to the logic state of an abnormal state detection signal generated in response to a monitoring signal;

(d) switching the integral signal to one of a sub-loop and a steady-state loop in response to the logic state of the switching control signal;

(e) receiving and processing the integral signal and generating and outputting a sub-negative feedback signal as the first negative feedback signal;

(f) receiving and modulating the integral signal into a pulse width modulation (PWM) signal and outputting an output signal, wherein the monitoring signal is the output signal or a modulated version of the output signal; and (g) processing the output signal and generating and outputting a steady-state negative feedback signal as the second negative feedback signal.

10. The amplification method of claim 9, wherein step (f) comprises:

modulating the integral signal output to the steady-state loop into the PWM signal using a sawtooth wave signal and outputting the PWM signal;

outputting an amplified signal according to the PWM signal; and outputting the output signal generated by performing low-pass filtering on the amplified signal.

11. The amplification method of claim 9, wherein step (c) comprises:

generating and outputting a sawtooth wave signal;

generating and outputting a signal representing the slope of the sawtooth wave signal, where the logic state of the signal representing the sawtooth wave signal changes according to the slope of the sawtooth wave signal;

in response to the monitoring signal, generating and outputting the abnormal state detection signal that has different logic states when the monitoring signal is greater than an upper threshold and less than a lower threshold; and generating the switching control signal whose logic state changes according to the logic state of the abnormal state detection signal and outputting the switching control signal.

12. The amplification method of claim 11, wherein when the output of the integral signal is switched from the sub-loop to the steady-state loop, the logic state of the switching control signal changes in synchronization with the sawtooth wave slope representing signal.

13. The amplification method of claim 11, wherein the monitoring signal is greater than the upper threshold in the abnormal state.

14. The amplification method of claim 13, wherein the sub-negative feedback signal generated in the abnormal state prevents the integral signal from becoming saturated.

15. The amplification method of claim 9, wherein the PWM signal maintains a pulse width that is half the pulse width of the PWM signal in the steady-state when the input signal is a fog signal, after the logic state of the switching control signal changes when the integral signal is switched from the sub-loop to the steady-state loop.

16. The amplification method of claim 15, wherein the pulse width of the PWM signal is the same pulse width as the pulse width of the switching control signal when the integral signal is switched from the sub-loop to the steady-state loop.

17. A class-D amplifier for generating an unsaturated integral signal, comprising:

a feedback controller for generating a control signal and outputting the control signal, the feedback controller comprising: a sawtooth wave signal generator for generating a sawtooth wave signal; a slope detector for generating a signal representing the slope of the sawtooth wave signal; an abnormal state detector for generating an abnormal state detection signal in response to a monitoring signal; and a feedback decider for generating the control signal in response to the abnormal state detection signal;

a switching circuit for receiving an integral signal and the control signal and outputting the integral signal to one of a sub-loop and a steady-state loop;

a sub-loop for receiving the integral signal and generating and outputting a first negative feedback signal;

a controlled circuit for receiving the integral signal, modulating the integral signal into an output signal, amplifying the output signal, filtering the output signal, and outputting the output signal; and a steady-state loop for receiving the output signal and generating and outputting a second negative feedback signal;

wherein the integral signal is unsaturated due to the first and second negative feedback signals.

18. The class-D amplifier of claim 17, further comprising:

a summing circuit for summing an input signal with one of the first and second negative feedback signals and outputting an error signal based on the summation.

19. The class-D amplifier of claim 18, further comprising:

an integral control circuit for integrating the error signal and outputting the integral signal.

* * * * *